United States Patent
Hsieh

(10) Patent No.: US 9,197,207 B2
(45) Date of Patent: Nov. 24, 2015

(54) TOUCH SENSOR CIRCUIT AND TOUCH DISPLAY DEVICE

(71) Applicant: PRINCETON TECHNOLOGY CORP., New Taipei (TW)

(72) Inventor: Chin-I Hsieh, Hsinchu (TW)

(73) Assignee: PRINCETON TECHNOLOGY CORP., New Taipei (TW)

( * ) Notice: Subject to any disclaimer, the term of this patent is extended or adjusted under 35 U.S.C. 154(b) by 262 days.

(21) Appl. No.: 13/684,233

(22) Filed: Nov. 22, 2012

(65) Prior Publication Data

US 2014/0084991 A1   Mar. 27, 2014

(30) Foreign Application Priority Data

Sep. 27, 2012   (TW) .............................. 101135559 A

(51) Int. Cl.
*H03K 17/96* (2006.01)
*G06F 3/041* (2006.01)
*G06F 3/044* (2006.01)

(52) U.S. Cl.
CPC .............. *H03K 17/962* (2013.01); *G06F 3/044* (2013.01); *G06F 3/0416* (2013.01); *G06F 3/0418* (2013.01); *H03K 2217/960735* (2013.01)

(58) Field of Classification Search
CPC ..... G06F 3/0416; G06F 3/0418; G06F 3/044; H03K 17/962; H03K 2217/960735
USPC .......................................................... 345/173
See application file for complete search history.

(56) References Cited

U.S. PATENT DOCUMENTS

| | | | |
|---|---|---|---|
| 2008/0048997 A1* | 2/2008 | Gillespie .............. | G06F 3/03547 345/174 |
| 2012/0176356 A1* | 7/2012 | Usukura ............... | G06F 3/0416 345/207 |
| 2013/0278538 A1* | 10/2013 | Brunet .................... | G06F 3/044 345/174 |

* cited by examiner

*Primary Examiner* — Amare Mengistu
*Assistant Examiner* — Jennifer Zubajlo
(74) *Attorney, Agent, or Firm* — Muncy, Geissler, Olds & Lowe, P.C.

(57) ABSTRACT

A touch sensor circuit and a touch device are provided. The touch sensor circuit includes a charging capacitor, a first current supplying unit, a second current supplying unit, and a switch unit. Wherein, the charging capacitor is serially connected between a detecting terminal and a reference voltage. The first current supplying unit is coupled to the detecting terminal, and receives a first bias voltage signal, and generates a first charging current at the detecting terminal according to the first bias voltage signal. A second current supplying unit is coupled to the detecting terminal, and receives a second bias voltage signal, and generates a second charging current at the detecting terminal according to the second bias voltage signal. The second terminal and the third terminal of the switch respectively supply the first and the second bias voltage signal.

15 Claims, 4 Drawing Sheets

TOUCH SENSOR CIRCUIT AND TOUCH DISPLAY DEVICE

CROSS-REFERENCE TO RELATED APPLICATION

This application claims the priority benefit of Taiwan application serial no. 101135559, filed on Sep. 27, 2012. The entirety of the above-mentioned patent application is hereby incorporated by reference herein and made a part of this specification.

BACKGROUND

1. Field of Invention

The present invention relates to touch sensor circuit. More particularly, the present invention relates to touch sensor circuit with multiple current sources.

2. Description of Related Art

FIG. 1 is a drawing, schematically illustrating a conventional touch sensor circuit 100. Referring to FIG. 1, a touch sensor circuit 100 includes a pulse signal generator 110, a touch sensing capacitor (CTA), a reset switch (SW1), a charging switch (SW2), a charging capacitor (C1) and an analog-to-digital converter (ADC) 120.

In detail, a first terminal of the pulse signal generator 110 receives a ground voltage GND, a second terminal of the pulse signal generator 110 is coupled to a first terminal of the touch sensing capacitor CTA. The charging switch SW2 is coupled in series between a second terminal of the touch sensing capacitor CTA and an input terminal of the ADC 120. The reset switch SW1 is coupled in series between the second terminal of the touch sensing capacitor CTA and the ground voltage GND.

In operation, when the touch sensor circuit 100 senses a touch event, such as an event that finger of user touches on the touch sensor circuit 100, the touch sensing capacitor CTA responds to the touch event. When a pulse signal PLS issued by the pulse signal generator 110 is applied on the touch sensing capacitor CTA and a pulse signal PLS with different pulse amplitude from the pulse amplitude of the pulse signal PLS before the touch sensing capacitor CTA being touched is produced and transmitted to the charging switch SW2. At this moment, the charging switch SW2 receives the sampling signal SP in a fixed frequency at the control terminal and is accordingly conducted or not-conducted. Here, the pulse signal PLS after sampling the charging is transmitted by the charging switch SW2 to the charging capacitor C1 and charges the charging capacitor C1 and then a detecting voltage Vdet is produced at the input terminal of the ADC 120. After then, the ADC 120 fetches the voltage value of the detecting voltage Vdet. A difference of the voltage values before touching and after touching can be used to judge whether or not at a touching state, that is, whether or not the touch sensor circuit 100 has sensed the touch event. In addition, the reset switch SW1 resets the detecting voltage Vdet according to the reset signal RST.

SUMMARY

The invention provides a touch sensor circuit to improve the sensing efficiency in touching operation.

The invention provides a touch sensor apparatus to improve the sensing efficiency in touching operation.

The invention provides a touch sensor circuit, including a touch sensing capacitor, a charging capacitor, a first current supplying unit, a second current supplying unit, and a switch unit. A first terminal of the touch sensing capacitor produces a voltage according to a touching state thereon. The charging capacitor is serially connected between a detecting terminal and a reference voltage. The first current supplying unit is coupled to the detecting terminal, and receives a first bias voltage signal, and generates a first charging current at the detecting terminal according to the first bias voltage signal. The second current supplying unit is coupled to the detecting terminal, and receives a second bias voltage signal, and generates a second charging current at the detecting terminal according to the second bias voltage signal. The first terminal of the switch unit is coupled to the touch sensing capacitor. The second terminal and the third terminal of the touch sensing capacitor are respectively coupled to the first and second current supplying units. According to the control signal, the first terminal of the switch unit is coupled to the second terminal or the third terminal. The second and third terminals of the switch unit respectively supply the first and second bias voltage signals.

The invention also provides touch sensor apparatus, including multiple touch sensor circuits. Each touch sensor circuit includes a touch sensing capacitor, a charging capacitor, a first current supplying unit, a second current supplying unit, and a switch unit. A first terminal of the touch sensing capacitor produces a voltage according to a touching state thereon. The charging capacitor is serially connected between a detecting terminal and a reference voltage. The first current supplying unit is coupled to the detecting terminal, and receives a first bias voltage signal, and generates a first charging current at the detecting terminal according to the first bias voltage signal. The second current supplying unit is coupled to the detecting terminal, and receives a second bias voltage signal, and generates a second charging current at the detecting terminal according to the second bias voltage signal. The first terminal of the switch unit is coupled to the touch sensing capacitor. The second terminal and the third terminal of the touch sensing capacitor are respectively coupled to the first and second current supplying units. According to the control signal, the first terminal of the switch unit is coupled to the second terminal or the third terminal. The second and third terminals of the switch unit respectively supply the first and second bias voltage signals. The touch sensor apparatus correspondingly performs the touch signal according to the voltage value at the detecting terminal.

The present invention provides a touch sensor circuit and the touch sensing apparatus in application. The switch unit of the touch sensor circuit supplies bias voltage signal alternatively at the second terminal and the thirds terminal. The cost of pulsing source can be saved by this architecture. Further, the touch sensor circuit includes two current supplying units, which can alternatively supply current to the detecting terminal. By this charging manner, the touch sensor circuit can charge the charging capacitor in full time, to improve the charging efficiency. In addition, fabrication cost of the touch sensor apparatus by this architecture can be reduced and the touching sensibility can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
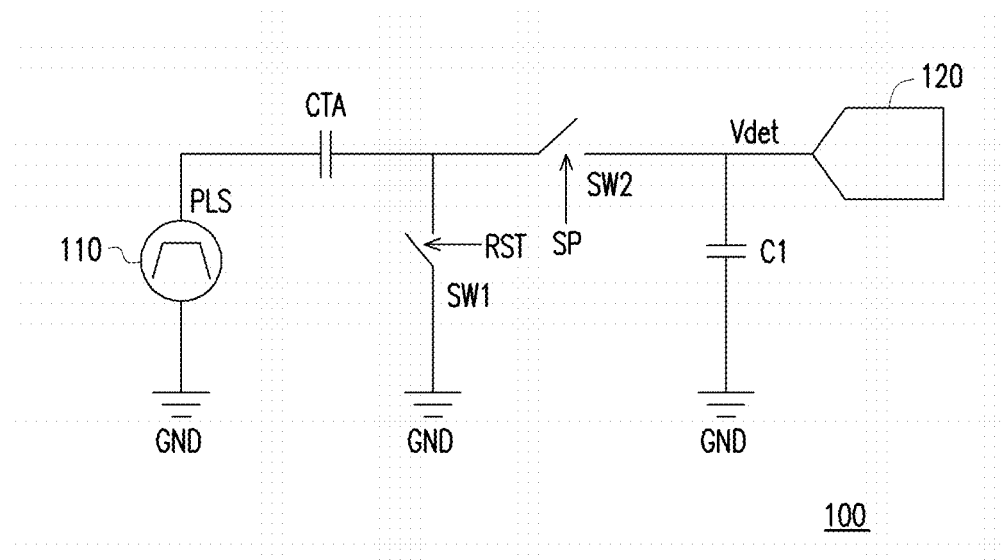
FIG. 1 is a drawing schematically illustrating a conventional touch sensor circuit 100.
Figure 2:
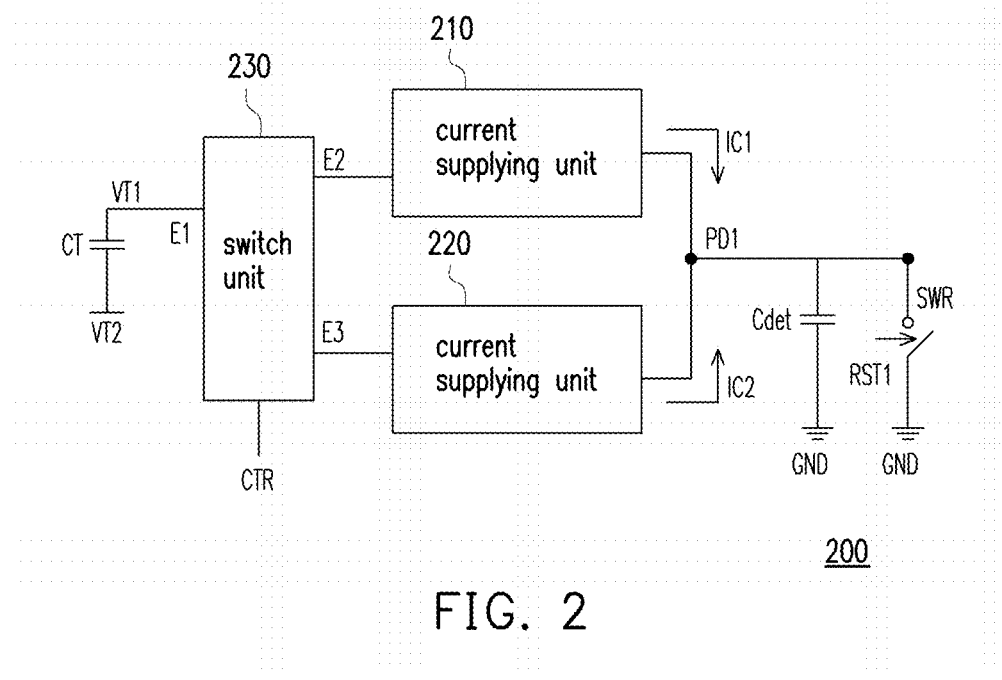
FIG. 2 is a drawing schematically illustrating the functional blocks of touch sensor circuit 200, according to an embodiment of the invention.

FIG. 2 is a drawing schematically illustrating the functional blocks of touch sensor circuit 200, according to an embodiment of the invention. Referring to FIG. 2, the touch sensor circuit 200 includes a current supplying unit 210, a current supplying unit 220, a switch unit 230, a touch sensing capacitor CT, a charging capacitor Cdet and a reset switch SWR. The charging capacitor Cdet is coupled in series between the detecting terminal PD1 and the reference voltage GND. In the embodiment, the reference voltage GND can be a ground voltage as an example. The current supplying unit 210 is coupled to the detecting terminal PD1, and the current supplying unit 220 is also coupled to the detecting terminal PD1. The switch unit 230 has three terminals E1-E3, of which the first terminal E1 is coupled to the touch sensing capacitor CT on the touch pane, the second terminal E2 and the third terminal E3 are respectively coupled to the current supplying units 210 and 220. In addition, the reset switch SWR is coupled in series between the NPDT PD1 and the reference voltage GND.

In operation, the switch unit 230 is controlled by the control signal CTR1 or CTR2, that are control signals CTR in different phase. The voltage VT1 at the first terminal E1 of the switch unit 230 is supplied to the current supplying unit 210 or 220 to serve as the bias voltage signals of the current supplying unit 210 or 220. Further, the second terminal of the touch sensing capacitor CT receives the touch reference voltage VT2. In an embodiment of the invention, the touch reference voltage VT2 can be a ground voltage or other voltage at direct-current (DC) level, which is the voltage level not at the ground voltage.

The control signals CTR1 and CTR2 are clock signals being out-of-phase to each other. According to the control signals CTR1 and CTR2, the switch unit 230 alternatively supplies the voltage at the first terminal E1 of the switch unit 230, that is the terminal coupled to the touch sensing capacitor CT, to the current supplying units 210 and 220 to respectively serve as the bias voltage signals for the current supplying units 210 and 220.

For the operation as a whole, first, the reset control signal RST1 is enabled, and the reset switch SWR receives the reset control signal RST1 being enabled and accordingly conducted. Further, the voltage level at the detecting terminal PD1 is pulled down to the voltage level at reference voltage GND. When the voltage level at the detecting terminal PD1 is pulled down and equal to the reference voltage GND, the reset control signal RST1 is disabled and the reset switch SWR is not-conducted.

Further, the first terminal E1 of the switch unit 230, according to the control signal CTR, is coupled to the second terminal E2 or the third terminal E3, to cause the voltage VT1 at the touch sensing capacitor CT to be transmitted to the current supplying unit 210 or the current supplying unit 220. Remarkably, when the bias voltage signal received by the current supplying unit 210 is equal to the voltage VT1, the current supplying unit 210 would generate the charging current IC1 according to the bias voltage signal, that is voltage VT1 being received, and transmits the produced charging current IC1 to the detecting terminal PD1 to charge the charging capacitor Cdet. On the other hand, when the bias voltage signal received by the current supplying unit 220 is equal to the voltage VT1, the current supplying unit 220 would generate the charging current IC2 according to the bias voltage signal, that is voltage VT1 being received, and transmits the produced charging current IC2 to the detecting terminal PD1 to charge the charging capacitor Cdet.

In an embodiment, by the control signal CTR, the touch sensor circuit 200 causes the charging capacitor Cdet to be repeatedly charged by the charging currents IC1 and IC2. After a fixed time period, the equivalent capacitance of the touch sensing capacitor CT can be obtained by detecting the voltage value on the detecting terminal PD1 of the charging capacitor Cdet. Then, the touching state on the touch sensing capacitor CT can be obtained.

Figure 3:
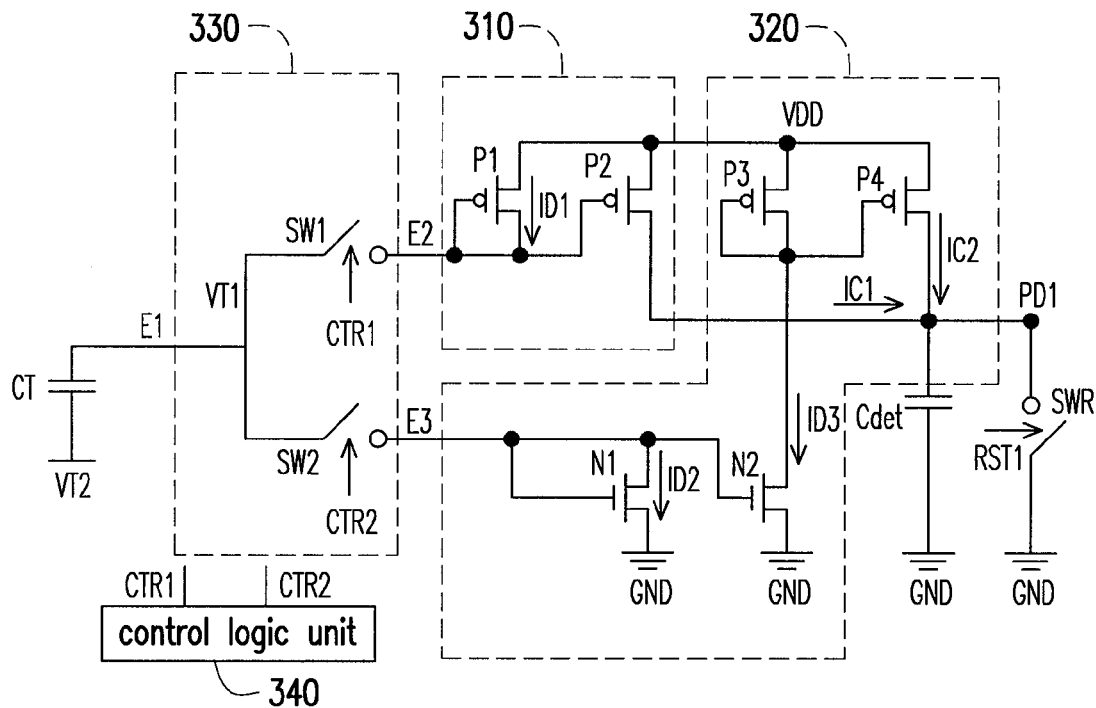
FIG. 3 is a drawing schematically illustrating a touch sensor circuit 300, according to another embodiment of the invention.

FIG. 3 is a drawing schematically illustrating a touch sensor circuit 300, according to another embodiment of the invention. Referring to FIG. 3, the touch sensor circuit 300 includes current supplying units 310 and 322, switch unit 330, control logic unit 340, touch sensing capacitor CT, charging capacitor Cdet, and reset switch SWR. The first terminal E1 of the switch unit 330 receives the voltage VT1 from the touch sensing capacitor CT. In addition, another terminal of the touch sensing capacitor CT receives the touch reference voltage VT2. The first terminals of the current supplying units 310 and 320 are respectively coupled to the second terminal E2 and the third terminal E3 of the switch unit 330 and the second terminals of the current supplying units 310 and 320 are coupled to the detecting terminal PD1. Further, the charging capacitor Cdet is coupled between the detecting terminal PD1 and the reference voltage GND, such as the ground voltage. The reset switch SWR is coupled between the detecting terminal PD1 and the reference voltage GND, wherein the reset switch SWR is conducted or not-conducted according to the reset control signal RST1. The control logic unit 340 is used to generate the control signals CTR1 and CTR2.

In detail, the switch unit 330 of an embodiment can include switch SW1 and switch SW2. The switch SW1 is coupled in series between the first terminal E1 and the second terminal E2 of the switch unit 330. The switch SW2 is coupled in series between the first terminal E1 and the third terminal E3 of the switch unit 330. The control terminals of the switches SW1 and SW2 are respectively receiving the control signals CTR1 and CTR2. The switches SW1 and SW2 are conducted or not-conducted according to the control signals CTR1 and CTR2. In an embodiment, the control signals CTR1 and CTR2 are the clock signals being out-of-phase, so the conducting states for the switch SW1 and the switch SW2 are reversed. Here, when the switch SW1 is conducted according to the control signal CTR1, that is, the switch SW2 is not conducted according to the control signal CTR2, the first terminal E1 of the switch unit 330 is connected to the second terminal E2 and the voltage VT1 is supplied to the current supplying unit 310 to serve as the bias voltage signal. Oppositely, when the switch SW2 is conducted according to the control signal CTR2, that is, the switch SW1 is not conducted according to the control signal CTR1, the first terminal E1 of the switch unit 330 is connected to the third terminal E3 and the voltage VT1 is supplied to the current supplying unit 320 to serve as the bias voltage signal.

The current supplying unit 310 includes transistor P1 such as P-type transistor, and transistor P2 such as P-type transistor. Each of the transistor P1 and transistor P2 has a first terminal such as source terminal, a second terminal such as drain terminal, and a control terminal such as gate terminal. The first terminals of the transistor P1 and transistor P2 are commonly receive the power voltage VDD. The second terminal of the transistor P1 is coupled to the second terminal E2 of the switch unit 330. The control terminal of the transistor P1 id coupled to the second terminal of the transistor P1. The second terminal of the transistor P2 is coupled to the detecting terminal PD1, and the control terminal of the transistor P2 is coupled to control terminal of the transistor P1.

Furthermore, when the voltage VT1 is supplied to the second terminal of the switch unit 330, which is the second terminal of the transistor P1, to serve the bias voltage signal, the transistor P1 generate the current ID1 according to the bias voltage signal that is the voltage VT. At the same time, the transistor P2 generates the current IC1 by mirror reflecting from the current generated by the transistor P1. The transistor P2 also supplies the current IC1 to the charging capacitor Cdet to charge the charging capacitor Cdet.

On the other hand, the current supplying unit 320 includes transistor N1 such as N-type transistor, transistor N such as N-type transistor, transistor P3 such as P-type transistor, and transistor P4, such as P-type transistor. Each of the transistors N1, N2, P1 and P2 has a first terminal such as source terminal, a second terminal such as drain terminal, and a control terminal such as gate terminal. The first terminals of the transistor N1 and N2 receive the reference voltage GND, such as ground voltage. The second terminal of the transistor N1 is coupled to the third terminal E3 of the switch unit 330. The control terminal of the transistor N1 id coupled to the second terminal of the transistor N1. The control terminal of the transistor N2 is coupled to the control terminal of the transistor N1. In addition, the first terminals of the transistors P3 and P4 receive the power voltage VDD. The second terminal of the transistor P3 is coupled to the second terminal of the transistor N2. The control terminal of the transistor P3 is coupled to the second terminal of the transistor P3. The control terminal of the transistor P4 is coupled to the control terminal of the transistor p3. The second terminal of the transistor P4 is coupled to detecting terminal PD1.

When the voltage VT1 is supplied to third terminal E3 of the switch unit 330, which is the second terminal of the transistor N1, to serve as the bias voltage signal, the transistor N1 generates the current ID2 according to the received bias voltage signal, which is the voltage Vt1. The transistor N2 mirror reflects the current ID2, so as to generate the current ID3. The current mirror formed between the transistors P3 and P4 generate the current IC2 by the mirror current ID3 and the current IC2 is supplied to the charging capacitor Cdet to charge it.

The voltage VT1 at the coupling node of the touch sensing capacitor CT and the first terminal E1 of the switch unit 330 is changed with respect to the touching state of the touch sensing capacitor CT. Therefore, in a fixed time period, the detecting terminal PD1 would have the voltage value due to charging the charging capacitor Cdet by the currents IC1 and IC2, in which the voltage value would change in accordance with the touch state on the touch sensing capacitor CT. So, by detecting the voltage value on the detecting terminal PD1 after a fixed time period, the touching state on the touch sensing capacitor CT can be obtained.

Additionally, an embodiment can have an analog-to-digital converter (not shown) to coupled to the detecting terminal PD1, and the voltage value on the detecting terminal PD1 can be converted into a digital data, which can be judged to known the touching state on the touch sensing capacitor CT.

Figure 4A:
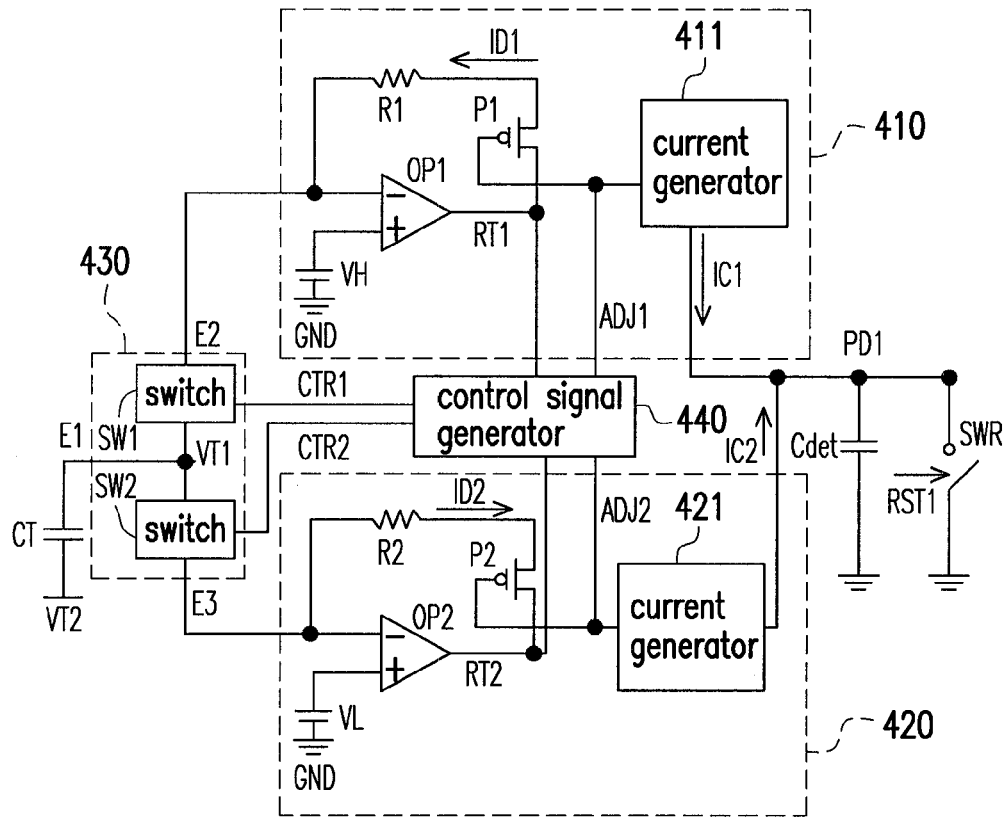
FIG. 4A is a drawing schematically illustrating a touch sensor circuit 400, according to further another embodiment of the invention.

FIG. 4A is a drawing schematically illustrating a touch sensor circuit 400, according to further another embodiment of the invention. Referring to FIG. 4A, the touch sensor circuit 400 includes touch sensor circuits 410 and 420, a switch unit 430, a touch sensing capacitor CT, a charging capacitor Cdet, a reset switch SWR, and a control signal generator 440. The first terminal of the switch unit 430 is coupled to the first terminal of the touch sensing capacitor CT and receives the voltage VT1. In addition, the second terminal of the touch sensing capacitor CT receives the touch reference voltage VT2. The second terminal E2 and the third terminal E3 of the switch unit 430 are respectively coupled to the first terminals of the current supplying units 410 and 420. The second terminals of the current supplying units 410 and 420 are coupled to the detecting terminal PD1. The charging capacitor Cdet is coupled in series between the detecting terminal PD1 and the reference voltage GND, such as ground voltage. The reset switch SWR is coupled in series between the detecting terminal PD1 and the reference voltage GND. The reset switch SWR is conducted or not conduced according to the reset control signal RST1. The control signal generator 440 is coupled to the current supplying unit 410, the current supplying unit 420, and the switch unit 430.

Remarkably, comparing to the previous embodiments, this embodiment includes the control signal generator 440, which can detect the comparing result to the voltage VT1 in the current supplying unit 410 or the current supplying unit 420, to accordingly generate the control signal CTR1 or CTR2 and then to control the switch unit 430 to pass the voltage VT1 to the current supplying unit 410 or the current supplying unit 420. The control signal generator 440 also generates the current adjusting signals ADJ1 or ADJ2 according to the previous comparison result. The current supplying units 410 and 420 then respectively charge the charging capacitor Cdet according to the current adjusting signals ADJ1 or ADJ2. Also and, the control signal generator 440 can count the positive pulses or negative pulses of the control signal CTR1 or CTR2. After the counting number of the positive pulses or negative pulses of the control signal CTR1 or CTR2 has reached to a preset threshold value, an enabling state of the reset control signal RST1 is generated to conduct the reset switch SWR and reset the detecting terminal PD1.

In detail, the switch unit 430 can include switch SW1 and switch SW2. The switch SW1 is coupled in series between the first terminal E1 and the second terminal E2 of the switch unit 430. The switch SW2 is coupled in series between the first terminal E1 and the third terminal E3 of the switch unit 430. The switches SW1 and SW2 are conducted or not-conducted according to the control signals CTR1 and CTR2 to alternatively pass the voltage VT1 to the current supplying units 410 and 420 to serve as the bias voltage signal of the current supplying units 410 and 420. Here, the control signals CTR1 and CTR2 are clock signals being out-of-phase to each other.

The current supplying unit 410 includes an operational amplifier OP1, a transistor P1 such as P-type transistor, a feedback resistor R1 and a current generator 411. The first input terminal of the operational amplifier OP1 is coupled to the second terminal E2 of the switch unit 430. The second input terminal of the operational amplifier OP1 is receiving a threshold voltage VH. The output terminal of the operational amplifier OP1 generates the comparison result RT1. The transistor P1 has a first terminal such as source terminal, second terminal such as drain terminal, and third terminal such as gate terminal. The first terminal of the transistor P1 is coupled to the output terminal of the operational amplifier OP1. The second terminal of the transistor P1 is coupled to the first terminal of the feedback resistor R1. The control terminal of the transistor P1 is coupled to the control signal generator 440 to receive the current adjusting signal ADJ1. The second terminal of the feedback resistor R1 is coupled to the first input terminal of the operational amplifier OP1. In addition, the current generator 411 is coupled to the control signal generator 440 to also receive the current adjusting signal ADJ1.

Furthermore, when the voltage VT1 is supplied to the first terminal of the current supplying unit 410, that is the first input terminal of the operational amplifier OP1, to serve as the bias voltage signal of the current supplying unit 410 and also when the voltage VT1 of the bias voltage signal is smaller than the threshold voltage VH, the operational amplifier OP1 outputs the comparison result RT1, such as the power voltage VDD. At this moment, the control signal generator 440, according to state of the comparison result RT1, generates the current adjusting signal ADJ1, such as the voltage level of the reference voltage GND, to cause the transistor P1 to generate the current ID1 at the second terminal with respect to the current adjusting signal ADJ1. On the other hand, the current generator 411 generates the charging current IC1 at the detecting terminal PD1 to charge the charging capacitor Cdet, according to the current adjusting signal ADJ1 at this moment.

Furthermore, when the touch sensing capacitor CT is charged and the voltage thereof is greater than the threshold voltage VH, that is, when the voltage VT1 is greater than the threshold voltage VH, the operational amplifier OP1 outputs the comparison result RT1, such as the voltage level of reference voltage GND, the control signal generator 440 generates the current adjusting signal ADJ1, such as the voltage level of the power voltage VDD, according to the comparison result RT1, to cause the current generator 411 to stop generating the charging current IC1. On the other hand, the control signal generator 440 also disables the control signal CTR1 and enables the control signal CTR2, according to the comparison result RT1, to cause the switch SW1 to be not conducted and the switch SW2 to be conducted.

The current supplying unit 420 includes an operational amplifier OP2, a transistor P2 such as P-type transistor, a feedback resistor R2 and a current generator 421. The first input terminal of the operational amplifier OP2 is coupled to the third terminal E3 of the switch unit 430. The second input terminal of the operational amplifier OP2 is receiving a threshold voltage VL. The output terminal of the operational amplifier OP2 generates the comparison result RT2. The transistor P2 has a first terminal such as source terminal, second terminal such as drain terminal, and third terminal such as gate terminal. The first terminal of the transistor P2 is coupled to the first terminal of the feedback resistor R2. The second terminal of the transistor P2 is coupled to the output terminal of the operational amplifier OP2. The control terminal of the transistor P2 is coupled to the control signal generator 440 to receive the current adjusting signal ADJ2. The second terminal of the feedback resistor R2 is coupled to the first input terminal of the operational amplifier OP2. In addition, the current generator 421 is coupled to the control signal generator 440 to also receive the current adjusting signal ADJ2.

In operation, when the voltage VT1 is supplied to the first terminal of the current supplying unit 420, that is the first input terminal of the operational amplifier OP2, to serve as the bias voltage signal of the current supplying unit 420 and also when the voltage VT1 of the bias voltage signal is greater than the threshold voltage VL, the operational amplifier OP2 outputs the comparison result RT2, such as the ground voltage GND. At this moment, the control signal generator 440, according to state of the comparison result RT2, generates the current adjusting signal ADJ2, such as the voltage level of the reference voltage GND, to cause the transistor P2 to generate the current ID2 at the first terminal with respect to the current adjusting signal ADJ2. On the other hand, the current generator 421 generates the charging current IC2 at the detecting terminal PD1 to charge the charging capacitor Cdet, according to the current adjusting signal ADJ2 at this moment.

When the touch sensing capacitor CT is charged and the voltage thereof is less than the threshold voltage VL, that is, when the voltage VT1 is less than the threshold voltage VL, the operational amplifier OP2 outputs the comparison result RT2, such as the voltage level of power voltage VDD. The control signal generator 440 generates the current adjusting signal ADJ2, such as the voltage level of the power voltage VDD, according to the comparison result RT2, to cause the current generator 421 to stop generating the charging current IC2. Also and, the control signal generator 440 disables the control signal CTR2 and enables the control signal CTR1, according to the comparison result RT2, to cause the switch SW2 to be not conducted and the switch SW1 to be conducted.

In the embodiment, the voltage VT1 at the coupling node of the touch sensing capacitor CT and the first terminal E1 of the switch unit 430 is changed with respect to the touching state of the touch sensing capacitor CT being touched. Thereby, the changing time for the comparison results RT1 and RT2 is also accordingly different, so that the periods of the control signal CTR1 and CTR2 are also different due to the touch sensing capacitor CT being touched. Further, the control signal generator 440 would count the number of the positive pulses or negative pulses of the control signals CTR1 or CTR2 until the counting number is equal to the preset threshold value. The analog-to-digital converter (not shown) coupled to the detecting terminal PD1 can convert the voltage value at the detecting terminal PD1 into the digital data and the touching state at the touch sensing capacitor CT can be known. Since the periods of the control signal CTR1 or CTR2 is changed when the touch sensing capacitor CT is touched, at the fixed counting number of pulses of the control signal CTR1 or CTR2, the charging time on the charging capacitor Cdet is also different. Thereby, as to whether or not the touch sensing capacitor CT is touched, the detected voltage at the detecting terminal PD1 is different, so as to achieve the detection function for touch.

Remarkably, in the embodiment, the threshold voltage VH is greater than the threshold voltage VL. In addition, the period of the controls signals CTR1 and CTR2 can be changed by changing the threshold voltage VH and the threshold voltage VL, thereby the cycle range of the counting number on the pulses of the control signal can be adjusted.

Figure 4B:
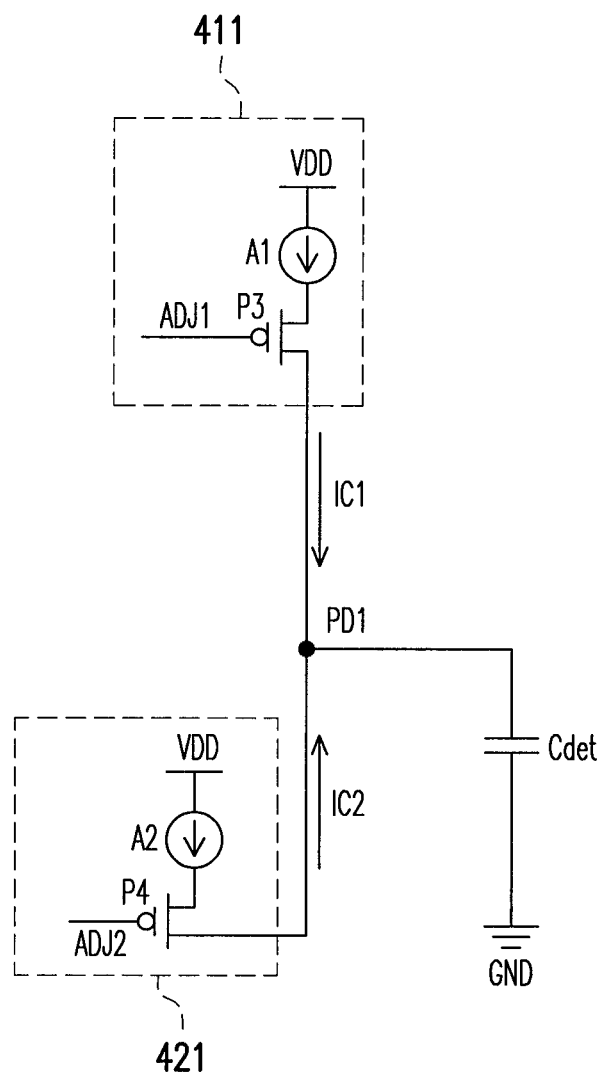
FIG. 4B is a drawing schematically illustrating the current generating units 411 and 421 in FIG. 4A, according to further another embodiment of the invention.

FIG. 4B is a drawing schematically illustrating the current generating units 411 and 421 in FIG. 4A, according to further another embodiment of the invention. Referring to FIG. 4B, the current generator 411 includes the transistor P3 such as P-type transistor and a current source A1. The current generator 421 includes the transistor P4 such as P-type transistor and a current source A2. Each of the transistors P3 and P4 has a first terminal such as source terminal, a second terminal such as drain terminal, and a control terminal such as gate terminal. For the current generator 411, the current source A1 is coupled in series between the power voltage VDD and the first terminal of the transistor P3. The second terminal of the transistor P3 is coupled to the detecting terminal PD1 and the control terminal of the transistor P3 is receiving the current adjusting signal ADJ1. For the current generator 421, the current source A2 is coupled in series between the power voltage VDD and the first terminal of the transistor P4. The second terminal of the transistor P4 is coupled to the detecting terminal PD1 and the control terminal of the transistor P4 is receiving the current adjusting signal ADJ2. When the current adjusting signal ADJ1 is at the voltage level of the reference voltage GND in an example, the transistor P3 conducts the current path for the charging current IC1. In addition, when the current adjusting signal ADJ2 is at the voltage level of the reference voltage GND in an example, the transistor P4 conducts the current path for the charging current IC2.

Also and, in an embodiment, the current generators 411 and 421 are not necessary to include the current sources A1 and A2. At this moment, the control signal generator 440 generates the bias voltage signal to serve as the current adjusting signal ADJ1 or ADJ2, to cause the transistor P3 or P4 to respond the bias voltage signal and respectively generates the charging current IC1 or IC2 at the second terminal.

Figure 5:
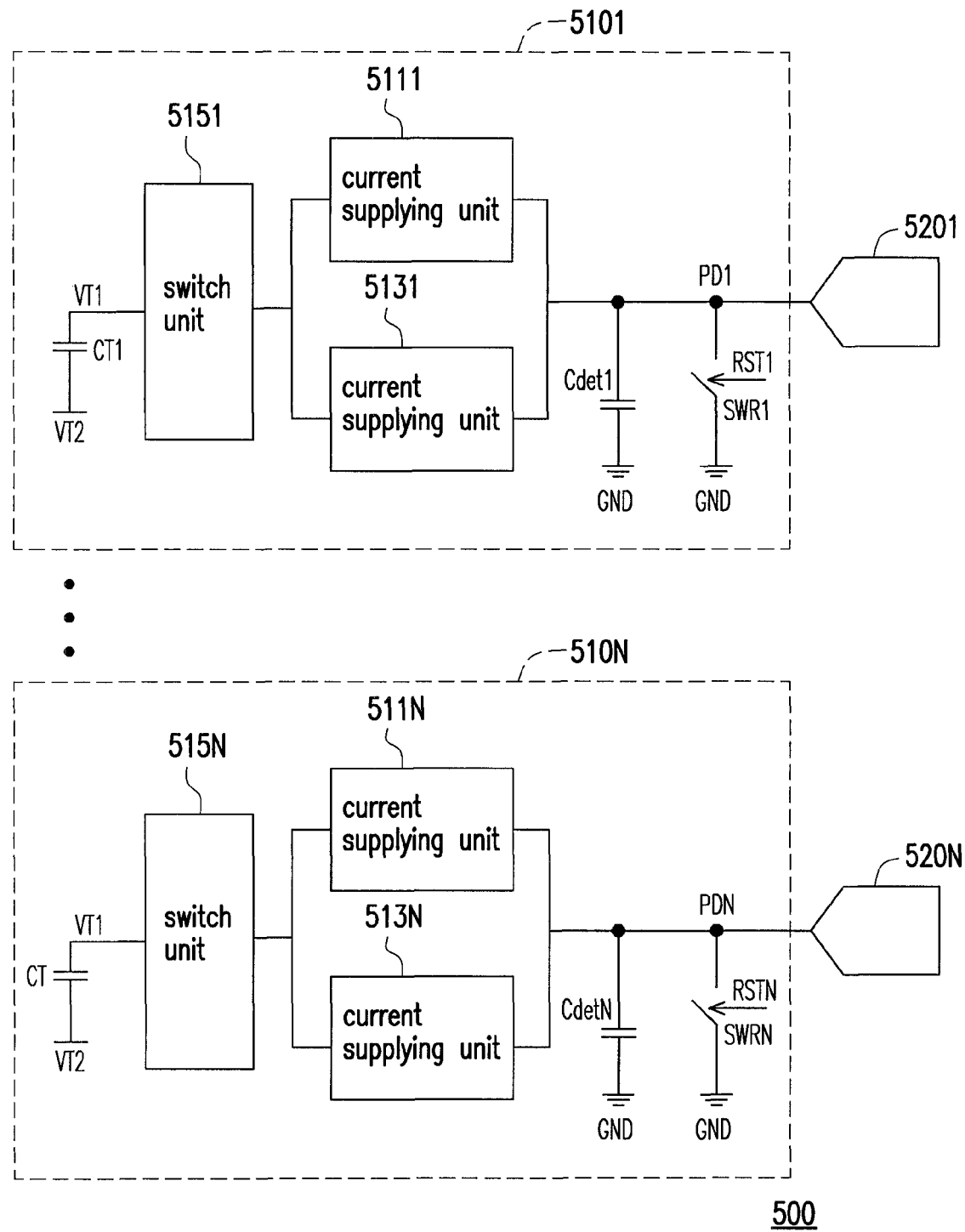
FIG. 5 is a drawing schematically illustrating a touch sensor apparatus 500, according to an embodiment of the invention.

FIG. 5 is a drawing schematically illustrating a touch sensor apparatus 500, according to an embodiment of the invention. Referring to FIG. 5, a touch sensor apparatus includes multiple touch sensor circuits 5101, 5102, . . . , 510N. Taking the touch sensor circuit 5101 as the example, the touch sensor circuit 5101 includes a current supplying unit 5111, a current supplying unit 5131, a switch unit 5151, a touch sensing capacitor CT1, a charging capacitor Cdet1 and a reset switch SWR1. Taking the touch sensor circuit 510N as the example, the touch sensor circuit 510N includes a current supplying unit 511N, a current supplying unit 513N, a switch unit 515N, a touch sensing capacitor CTN, a charging capacitor CdetN and a reset switch SWRN. The touch sensor circuits 5101-510N respectively transmit the voltages at the detecting terminals PD1-PDN to the processors 5201-520N, to cause the processors 5201-520N to generate the detection results about being touched.

The operation of the touch sensor circuits 5101-510N is the same as the foregoing operations in the previous embodiments of the touch sensor circuit. Also and, the operation in detail has been described in the previous embodiments, and is not further described here.

The invention provides a touch sensor circuit and a touch sensor apparatus implemented with the touch sensor circuit. The switch unit of the touch sensor circuit alternatively supplies the bias voltage signal at the second terminal and third terminal, thereby the cost of pulse source can be save according the architecture. Further, the two current supplying units of the touch sensor circuit are alternatively charging the charging capacitor in full time, to accelerate the charging efficiency. In addition, the touch sensor circuit of the invention can detect the voltage at the detecting terminal according to a fixed time period or a fixed counting number of the pulses of the control signal. It would be more flexible in application. The touch sensor apparatus of the invention has low cost and high sensibility.

It will be apparent to those skilled in the art that various modifications and variations can be made to the architecture of the present invention without departing from the scope or spirit of the invention. In view of the foregoing descriptions, it is intended that the present invention covers modifications and variations of this invention if they fall within the scope of the following claims and their equivalents.

What is claimed is:

1. A touch sensor circuit, comprising:
   a touch sensing capacitor, wherein a first terminal of the touch sensing capacitor produces a voltage according to a touching state thereon;
   a charging capacitor, serially connected between a detecting terminal and a reference voltage;
   a first current supplying unit, coupled to the detecting terminal, receiving a first bias voltage signal, and generating a first charging current at the detecting terminal according to the first bias voltage signal;
   a second current supplying unit, coupled to the detecting terminal, receiving a second bias voltage signal, and generating a second charging current at the detecting terminal according to the second bias voltage signal; and
   a switch unit, wherein a first terminal of the switch unit is coupled to the touch sensing capacitor, a second terminal and a third terminal of the touch sensing capacitor are respectively coupled to the first current supplying and the second current supplying unit, the first terminal of the switch unit is coupled to the second terminal or the third terminal according to a control signal, the second and third terminals of the switch unit respectively supply the first and second bias voltage signals; and
   wherein the second current supplying unit comprises:
   a third transistor, having a first terminal, a second terminal and a control terminal, wherein the first terminal receives the reference voltage, the second terminal of the third transistor is coupled to the switch unit, and the control terminal of the third transistor is coupled to the second terminal of the third transistor;
   a fourth transistor, having a first terminal, a second terminal and a control terminal, wherein the first terminal receives the reference voltage, and the control terminal of the fourth transistor is coupled to the control terminal of the third transistor;
   a fifth transistor, having a first terminal, a second terminal and a control terminal, wherein the first terminal receives the power voltage, the second terminal of the fifth transistor is coupled to the second terminal of the fourth transistor, and the control terminal of the fifth transistor is coupled to the second terminal of the fifth transistor; and
   a sixth transistor, having a first terminal, a second terminal and a control terminal, wherein the first terminal receives the power voltage, second terminal of the sixth transistor is coupled to the detecting terminal, and the control terminal of the sixth transistor is coupled to the control terminal of the fifth transistor.

2. The touch sensor circuit of claim 1, further comprising a reset switch, coupled between the detecting terminal and a ground voltage, and the reset switch resetting the detecting terminal according to a reset control signal.

3. The touch sensor circuit of claim 1, wherein the switch unit comprises:
   a first switch, coupled in series between the first terminal and the second terminal of the switch unit, and the first switch being conducted or not-conducted according to the control signal; and
   a second switch, coupled in series between the first terminal and the third terminal of the switch unit, and the second switch being conducted or not-conducted according to the control signal, wherein the first switch and the second switch have opposite connection states being conducted or not-conducted.

4. The touch sensor circuit of claim 1, wherein the first current supplying unit comprises:
a first transistor, having a first terminal, a second terminal and a control terminal, wherein the first terminal receives a power voltage, the second terminal of the first transistor is coupled to the switch unit, and the control terminal of the first transistor is coupled to the second terminal of the first transistor; and
a second transistor, having a first terminal, a second terminal and a control terminal, wherein the first terminal receives a power voltage, the second terminal of the second transistor is coupled to the detecting terminal, and the control terminal of the second transistor is coupled to the control terminal of the first transistor.

5. The touch sensor circuit of claim 1, further comprising:
a control logic unit, coupled to the switch unit and generating the control signal according to the first bias voltage signal or the second bias voltage signal.

6. The touch sensor circuit of claim 1, wherein the first current supplying unit comprises:
a first operational amplifier, of which a first input terminal receives the first bias voltage signal and a second input terminal receives a first threshold voltage, and an output terminal generates a first comparison result;
a first transistor, having a first terminal, a second terminal and a control terminal, wherein the second terminal is coupled to the output terminal of the first operational amplifier, the control terminal of the first transistor receives a first current adjusting signal;
a feedback resistor, coupled in series between the first input terminal of the first operational amplifier and the first terminal of the first transistor; and
a first current generator, coupled to the first transistor and the charging capacitor, receiving the first current adjusting signal, wherein the first current generator supplies the first charging current according to the first current adjusting signal.

7. The touch sensor circuit of claim 6, wherein the second current supply unit comprises:
a second operational amplifier, of which a first input terminal receives the second bias voltage signal and a second input terminal receives a second threshold voltage, and an output terminal generates a second comparison result;
a second transistor, having a first terminal, a second terminal and a control terminal, wherein the second terminal is coupled to the output terminal of the second operational amplifier, the control terminal of the second transistor receives a second current adjusting signal;
a second feedback resistor, coupled in series between the first input terminal of the second operational amplifier and the first terminal of the second transistor; and
a second current generator, coupled to the second transistor and the charging capacitor, receiving the second current adjusting signal, wherein the second current generator supplies the second charging current according to the second current adjusting signal.

8. The touch sensor circuit of claim 1, further comprising:
a control signal generator, coupled to the switch unit, the first current supplying unit and the second current supplying unit, wherein the control signal generator generates the control signal and generate the first current adjusting signal or the second current adjusting signal, according to the first bias voltage signal or the second bias voltage signal.

9. A touch sensor apparatus, comprises:
a plurality of touch sensor circuits, each of the touch sensor circuits comprises:
a touch sensing capacitor, wherein a first terminal of the touch sensing capacitor produces a voltage according to a touching state thereon;
a charging capacitor, serially connected between a detecting terminal and a reference voltage;
a first current supplying unit, coupled to the detecting terminal, receiving a first bias voltage signal, and generating a first charging current at the detecting terminal according to the first bias voltage signal;
a second current supplying unit, coupled to the detecting terminal, receiving a second bias voltage signal, and generating a second charging current at the detecting terminal according to the second bias voltage signal; and
a switch unit, wherein a first terminal of the switch unit is coupled to the touch sensing capacitor by a corresponding sensing pad, a second terminal and a third terminal of the touch sensing capacitor are respectively coupled to the first current supplying and the second current supplying unit, the first terminal of the switch unit is coupled to the second terminal or the third terminal according to a control signal, the second and third terminals of the switch unit respectively supply the first and second bias voltage signals,
wherein the touch sensor apparatus correspondingly performs a touch signal according to a voltage value at the detecting terminal;
wherein the first current supplying unit comprises:
a first transistor, having a first terminal, a second terminal and a control terminal, wherein the first terminal receives a power voltage, the second terminal of the first transistor is coupled to the switch unit, and the control terminal of the first transistor is coupled to the second terminal of the first transistor; and
a second transistor, having a first terminal, a second terminal and a control terminal, wherein the first terminal receives a power voltage, the second terminal of the second transistor is coupled to the detecting terminal, and the control terminal of the second transistor is coupled to the control terminal of the first transistor; and
wherein the second current supplying unit comprises:
a third transistor, having a first terminal, a second terminal and a control terminal, wherein the first terminal receives the reference voltage, the second terminal of the third transistor is coupled to the switch unit, and the control terminal of the third transistor is coupled to the second terminal of the third transistor;
a fourth transistor, having a first terminal, a second terminal and a control terminal, wherein the first terminal receives the reference voltage, and the control terminal of the fourth transistor is coupled to the control terminal of the third transistor;
a fifth transistor, having a first terminal, a second terminal and a control terminal, wherein the first terminal receives the power voltage, the second terminal of the fifth transistor is coupled to the second terminal of the fourth transistor, and the control terminal of the fifth transistor is coupled to the second terminal of the fifth transistor; and
a sixth transistor, having a first terminal, a second terminal and a control terminal, wherein the first terminal receives the power voltage, second terminal of the sixth transistor is coupled to the detecting terminal, and the control terminal of the sixth transistor is coupled to the control terminal of the fifth transistor.

10. The touch sensor apparatus of claim 9, further comprising a reset switch, coupled between the detecting terminal and a ground voltage, and the reset switch resetting the detecting terminal according to a reset control signal.

11. The touch sensor apparatus of claim 9, wherein the switch unit comprises:
 a first switch, coupled in series between the first terminal and the second terminal of the switch unit, and the first switch being conducted or not-conducted according to the control signal; and
 a second switch, coupled in series between the first terminal and the third terminal of the switch unit, and the second switch being conducted or not-conducted according to the control signal,
 wherein the first switch and the second switch have opposite connection states being conducted or not-conducted.

12. The touch sensor apparatus of claim 9, further comprising:
 a control logic unit, coupled to the switch unit and generating the control signal according to the first bias voltage signal or the second bias voltage signal.

13. The touch sensor apparatus of claim 9, wherein the first current supplying unit comprises:
 a first operational amplifier, of which a first input terminal receives the first bias voltage signal and a second input terminal receives a first threshold voltage, and an output terminal generates a first comparison result;
 a first transistor, having a first terminal, a second terminal and a control terminal, wherein the second terminal is coupled to the output terminal of the first operational amplifier, the control terminal of the first transistor receives a first current adjusting signal;
 a feedback resistor, coupled in series between the first input terminal of the first operational amplifier and the first terminal of the first transistor; and
 a first current generator, coupled to the first transistor and the charging capacitor, receiving the first current adjusting signal, wherein the first current generator supplies the first charging current according to the first current adjusting signal.

14. The touch sensor apparatus of claim 13, wherein the second current supply comprises:
 a second operational amplifier, of which a first input terminal receives the second bias voltage signal and a second input terminal receives a second threshold voltage, and an output terminal generates a second comparison result;
 a second transistor, having a first terminal, a second terminal and a control terminal, wherein the second terminal is coupled to the output terminal of the second operational amplifier, the control terminal of the second transistor receives a second current adjusting signal;
 a second feedback resistor, coupled in series between the first input terminal of the second operational amplifier and the first terminal of the second transistor; and
 a second current generator, coupled to the second transistor and the charging capacitor, receiving the second current adjusting signal, wherein the second current generator supplies the second charging current according to the second current adjusting signal.

15. The touch sensor apparatus of claim 9, further comprising:
 a control signal generator, coupled to the switch unit, the first current supplying unit and the second current supplying unit, wherein the control signal generator generates the control signal and generate the first current adjusting signal or the second current adjusting signal, according to the first bias voltage signal or the second bias voltage signal.

\* \* \* \* \*